United States Patent [19]
Mercado

[11] Patent Number: 5,969,803
[45] Date of Patent: Oct. 19, 1999

[54] LARGE NA PROJECTION LENS FOR EXCIMER LASER LITHOGRAPHIC SYSTEMS

[75] Inventor: Romeo I. Mercado, Fremont, Calif.

[73] Assignee: Nikon Corporation, Tokyo, Japan

[21] Appl. No.: 09/109,997

[22] Filed: Jun. 30, 1998

[51] Int. Cl.$^6$ .............................. G03B 27/54; G02B 9/34
[52] U.S. Cl. .............................. 355/67; 359/774
[58] Field of Search .................. 355/53, 67, 71; 359/771–774, 754, 649, 650

[56] References Cited

U.S. PATENT DOCUMENTS

| | | | |
|---|---|---|---|
| 4,779,966 | 10/1988 | Friedman | 350/442 |
| 4,891,663 | 1/1990 | Hirose | 355/53 |
| 4,948,238 | 8/1990 | Araki | 350/469 |
| 4,964,704 | 10/1990 | Shinohara | 350/433 |
| 5,142,409 | 8/1992 | Hanzawa et al. | 359/355 |
| 5,170,207 | 12/1992 | Tezuka et al. | 355/53 |
| 5,231,540 | 7/1993 | Shibata | 359/684 |
| 5,260,832 | 11/1993 | Togino et al. | 359/679 |
| 5,305,138 | 4/1994 | Freedenberg et al. | 359/355 |
| 5,353,157 | 10/1994 | Horiuchi | 359/676 |
| 5,448,408 | 9/1995 | Togino et al. | 359/651 |
| 5,519,537 | 5/1996 | Shikama | 359/649 |
| 5,537,260 | 7/1996 | Williamson | 359/727 |
| 5,555,479 | 9/1996 | Nakagiri | 359/355 |
| 5,579,171 | 11/1996 | Suzuki et al. | 359/687 |
| 5,636,000 | 6/1997 | Ushida et al. | 355/30 |
| 5,852,490 | 12/1998 | Matsuyama | 355/67 |

*Primary Examiner*—Safet Metjahic
*Assistant Examiner*—Hung Henry Nguyen
*Attorney, Agent, or Firm*—H. Donald Nelson

[57] ABSTRACT

An apparatus and method for transferring a pattern on a reticle onto a wafer includes a projection lens system having four groups of lens elements. The projection lens system satisfies the conditions: $0.3 < |f_{G2}/L| < 4.46$, $1.8 < |f_{G3}/L| < 4.8$, $0.05 < |f_{G2}/f_{G3}| < 0.25$, $0.77 < |f_{G1}/f_{G4}| < 1.1$, $0.17 < f_{G4}/F < 0.195$, $0.14 < f_{G1}/F < 0.191$, and having a numerical aperture equal to or greater than 0.60.

20 Claims, 9 Drawing Sheets

LARGE NA PROJECTION LENS FOR EXCIMER LASER LITHOGRAPHIC SYSTEMS

FIELD OF THE INVENTION

This invention relates generally to projection lens system for excimer laser exposure lithography in which a pattern formed on a mask or reticle is transferred onto a substrate such as a semiconductor wafer or glass plate. More particularly, the present invention is directed to projection lens systems for excimer laser exposure lithography in which the lens systems have a numerical aperture of at least 0.60 and an exposure field of at least 26.40 mm diameter at the wafer plane.

BACKGROUND OF THE INVENTION

In semiconductor device manufacturing, projection optical systems are used to transfer integrated circuit (IC) patterns such as large scale integrated (LSI) circuit patterns from a reticle, also known as a mask, onto a wafer or semiconductor substrate upon which the semiconductor device is to be formed. Because of the difference in the relative sizes of the reticle and the resulting semiconductor device, also known as a die or a semiconductor chip, the projection optical system must be a reduction projection optical system.

Modem integrated circuits are becoming more integrated; that is, more and more functions are being integrated into circuits that are to be included in a single die. At the same time, however, there is a major effort not to allow the die to grow in size in order to maintain or improve the performance and speed of the semiconductor device being manufactured. In order to maintain the same or reduced die size, the reduction projection optical system must have a wider exposure area and a higher resolution.

The drive toward higher density circuitry in microelectronic devices has increased interest in a variety of high-resolution lithographic techniques that produce finer resolution patterns at high production rates. The resolution of a lithographic lens system is a function of the exposure wavelength and the numerical aperture of the projection lens system. The resolution or minimum resolvable feature size is directly proportional to wavelength and inversely proportional to the numerical aperture, as follows (a lower value for resolution indicates better resolution):

resolution=$k\lambda/NA$, where k is a proportionality constant, $\lambda$ is the exposure wavelength and NA is the numerical aperture. One method to achieve better resolution of the optical system is to illuminate the reticle with shorter wavelength illumination and/or to use a projection lens system with a higher numerical aperture. In principle, the shorter the wavelength and/or the higher the numerical aperture of the projection lens system, the better the resolution. In the search for shorter wavelength illumination sources, there have been identified several excimer lasers that can be used as illumination sources for semiconductor photolithography, including the KrF excimer laser with a wavelength of 248.4 nanometers and the ArF excimer laser with a wavelength of 193 nanometers. These excimer lasers replace the traditional illumination sources that have been used for semiconductor manufacturing such as the deuterium lamp or the xenon-mercury arc lamp. The xenon-mercury arc lamp supplies the g-line that has a wavelength of 436 nanometers and the I-line that has a wavelength of 365 nanometers. These two spectral lines have been the mainstay illumination used in semiconductor wafer manufacturing.

One of the advantages of using an excimer laser as an illumination source is that the excimer laser can produce an average power of several watts at a number of wavelengths. The high brightness of the excimer laser light source can either be used to obtain extremely fast exposures or a significantly smaller numerical aperture can be used in the projection lens system and still obtain reasonable exposure times. A smaller numerical aperture results in a larger depth of field that increases quadratically with the inverse of the numerical aperture. One advantage of a larger depth of field permits larger tolerances in wafer distortion and focus that lead to better lithographic patterns.

The excimer gas selected for use in the excimer laser may include only one gas, in which case the output is at the wavelength that is characteristic of the single excimer gas. The choice of which excimer gas to use depends on several factors, such as the characteristics of the photoresist being used in the semiconductor manufacturing process. For example, the KrF excimer gas produces an illumination output at 248.4 nanometers that is suitable for exposing photoresists such as novolak resin sensitized with a diazo ketone.

Because an excimer laser has sufficient power at a single wavelength, another major advantage associated with using an excimer laser is that the aberration correction is simplified because the optics can be designed for a single wavelength. Because a single wavelength is used in a particular lens system means, for example, that chromatic aberration problems would be minimized.

As the integrated circuits (ICs) have become more sophisticated, the projection optical systems utilized to transfer the circuit patterns onto the semiconductor wafers or other receptive substrates (e.g., glass plates, etc.) have been required to achieve higher and higher performance levers. These higher performance levels include achieving higher resolution and the maintenance of high levels of aberration correction or the achieving of higher levels of aberration correction at large exposure field areas.

Accordingly, there is a need for projection lens systems having large numerical apertures, large reduction ratios, and large exposure field sizes at the wafer plane with good aberration correction.

SUMMARY OF THE INVENTION

A projection lens system in accordance with the present invention solves the above and other problems associated with conventional projection lens systems by maintaining or increasing the performance in comparison to existing optical lens systems.

The above and other objects and advantages of the present invention are attained through projection lens systems according to several embodiments of the present invention in which patterns on a reticle are transferred onto a substrate. In each of the several embodiments, an illumination system uniformly illuminates the reticle with illumination having a wavelength $\lambda$. A reticle stage supports the reticle and a substrate stage supports the substrate. A projection lens system having four groups of lens elements is disposed between the reticle and the substrate. The projection lens system satisfies the conditions: $0.3<|f_{G2}/L|<0.46$ and $1.8<|f_{G3}/L|<4.8$.

In one aspect of the present invention, the projection lens system satisfies the condition $0.05<|f_{G2}/f_{G3}|<0.25$.

In another aspect of the present invention, the projection lens system satisfies the condition: $0.77<|f_{G1}/f_{G4}|<1.1$.

In still another aspect of the present invention, the projection system satisfies the conditions: $0.17<f_{G4}/F<0.195$ and $0.14<f_{G1}/F<0.191$.

The projection lens systems all have a numerical aperture equal to or greater than 0.60.

The method and apparatus of the invention thus provides projection exposure apparatus' that have large numerical apertures, large field exposure areas at the wafer plane, large reduction values and good aberration correction.

These and other advantages of the present invention will become more apparent upon a reading of the detailed description of the preferred embodiment or embodiments that follow, when considered in conjunction with the drawings of which the following is a brief description. It should be clear that the drawings are merely illustrative of the currently preferred embodiment of the present invention, and that the invention is in no way limited to the illustrated embodiment. As will be realized, the invention is capable of other embodiments and its several details are capable of modifications in various obvious aspects, all without departing from the scope of the invention. The present invention is best defined by the claims appended to this specification.

BRIEF DESCRIPTION OF THE DRAWINGS

The novel features believed characteristic of the invention are set forth in the appended claims. The invention itself, however, as well as a preferred mode of use, and further objects and advantages thereof, will best be understood by reference to the following detailed description of illustrative embodiments when read in conjunction with the accompanying drawings, wherein:

DETAILED DESCRIPTION

Figure 1A:
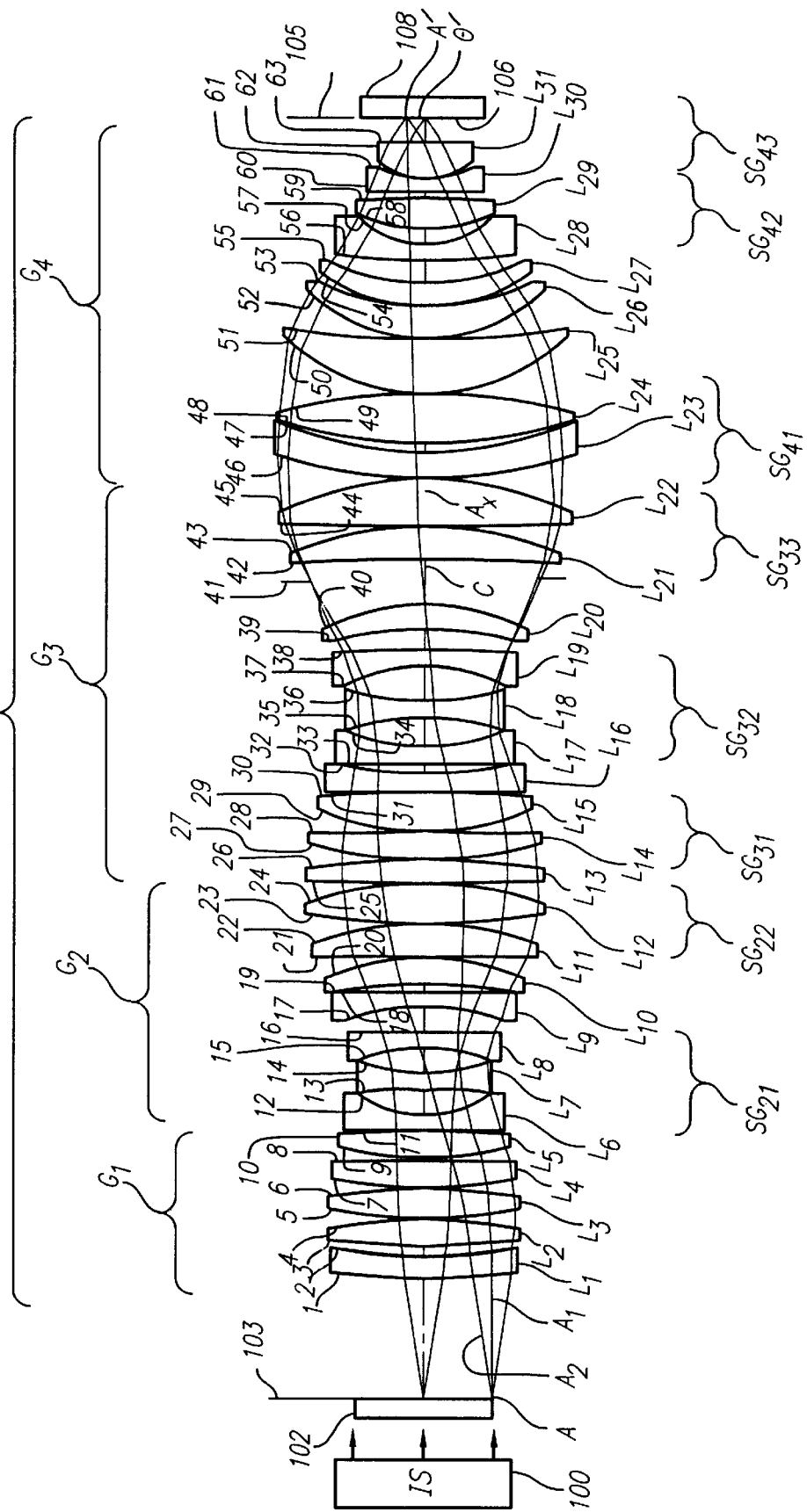
FIG. 1A is a schematic diagram of a projection lens system according to a first embodiment of the present invention.

The following detailed description is of the presently preferred embodiment of the present invention. It is to be understood that while the detailed description is given utilizing the drawings briefly described above, the invention is not limited to the illustrated embodiment. In the detailed description, like reference numbers refer to like elements.

Referring now to the Figures, the several embodiments of the present invention will now be described. According to standard practice in the optical art, drawings of optical lens systems, such as those shown in the Figures, have the object space, defined as all the space from the first element of surface of a system towards the object and beyond, on the left in the drawing. Similarly, the image space, defined as all the space from the last element or surface of a system towards the image and beyond, is on the right in the drawings.

FIG. 1A, a first embodiment of a reduction projection lens system in accordance with the present invention. In general, a projection lens system such as the projection lens system shown in FIG. 1A includes an illumination system (IS) 100, a reticle 102, located at the object or reticle plane 103, a projection lens system 104, and a wafer 106 located at the image (IMG) or wafer plane 105 and mounted on a wafer stage 108. As can be appreciated by a person of ordinary skill in the semiconductor manufacturing art, the above components are mounted in a stable secure structure that is not shown in this or any of the succeeding figures. The mounting structure is well known in the semiconductor manufacturing art and will not be discussed. The mounting structure holds the reticle 102 in the object plane 103 and holds the wafer 106 in the wafer plane 105.

The illumination system 100 includes a source of illumination, such as a KrF excimer laser emitting illumination at a wavelength $\lambda$ of 248.4 nanometers or an ArF excimer laser emitting illumination at a wavelength $\lambda$ of 193 nanometers. The following detailed description will be limited to a discussion of an exposure apparatus using a KrF excimer laser emitting illumination at a wavelength $\lambda$ of 248.4 nanometers. Other excimer lasers are known in the art and could be used in place of the KrF excimer laser with minor modification to the projection lens system. Examples of illumination systems may be found in, for example, U.S. Pat. Nos.: 4,619,508; 4,851,978; 4,939,630; 5,237,367; 5,307,207; and 5,392,094. These patents are incorporated herein by reference in their entirety. An example of an exposure apparatus suing an excimer laser source may be found in U.S. Pat. No. 4,952,945. This patent is incorporated herein by reference in its entirety. A projection exposure apparatus utilizing the output of an excimer laser to transfer the pattern of a reticle onto a semiconductor wafer is known from U.S. Pat. No. 4,458,994. U.S. Pat. No. 4,458,994 is also incorporated herein by reference in its entirety.

Referring to FIG. 1A there is shown an off-axis point A on the reticle with traces $A_1$ and $A_2$ representing light rays originating from point A. The ray traces that originate at point A and pass through the pupil defined by the aperture stop 41 contribute to form a point image at the point A' on the wafer surface. The ray of light $A_1$ passing through the center point C on the optical axis AX in the pupil is called a chief ray or principal ray. A chief ray or principal ray is parallel to the optical axis AX in the spaces on the object surface side and the image side in the case of a projection optical system in which both sides are telecentric. A ray from an axial object point $A_0$ on the reticle that just passes through the pupil or aperture stop is called a marginal ray. The sine of the angle $\theta$ between the marginal ray and the optical axis at the image plane at $A_0'$ corresponds to the numerical aperture NA on the wafer side of such a projection optical system and therefore the numerical aperture for the system is expressed as NA=n sin $\theta$, where n is the refractive index of the image space medium, which is equal to unity for air. The numerical aperture of such a projection optical system is generally represented as the wafer side value.

Referring again to FIG. 1A, the projection lens system 104, viewed from the object side, in order of succession, includes a first group of lens elements $G_1$ with an overall positive refractive power, a second group of lens elements $G_2$ with an overall negative refractive power, a third group of lens elements $G_3$ with an overall positive refractive power, and fourth group of lens elements $G_4$ with an overall positive refractive power. An aperture stop 41 is disposed in the third group of lens elements $G_3$.

The projection exposure apparatus shown in FIG. 1A satisfies the conditions:

$$0.3 < |f_{G2}/L| < 0.46 \text{ and}$$

$$1.8 < |f_{G3}/L| < 4.8,$$

where $f_{G2}$ is the focal length of the second group of lens elements $G_2$, $f_{G3}$ is the focal length of the third group of lens elements $G_3$, and L is axial distance measured along the optical axis AX from the object plane 103 to the wafer plane 105. In the embodiment shown in FIG. 1A, $f_{G2}/L=0.31625$ and $f_{G3}/L=1.8616$. If the above ratios are outside the ranges, it becomes not only difficult to correct the aberrations individually but to balance the aberration correction of the field dependent aberrations (image field curvature, astigmatism, coma, and distortion) together with spherical aberration which is dependent upon the NA of the projection lens system. The above conditions also affect the uniformity and balance of the maximum diameters of the lens groups in the projection lens system. Specifically, if the ratio $|f_{G2}/L|$ is less than 0.3 (holding the ratio $|f_{G3}/L|$ fixed) the beam expansion ratio decreases resulting in a more uniformly shaped lens system, however, the angular magnification increases making it more difficult to correct field dependent aberrations although it is easier to correct spherical aberration. If the ratio $|f_{G2}/L|$ is greater than 0.46 (holding the ratio $|f_{G3}/L|$ fixed) the beam expansion ratio increases resulting in an irregular shaped lens system and the angular magnification decreases making it more difficult to correct for spherical aberration although it is easier to correct field dependent aberrations. If the ratio $|f_{G3}/L|$ is less than 1.8 (holding the ratio $|f_{G2}/L|$ fixed) the beam expansion ratio increases resulting in an irregular shaped lens system and the angular magnification decreases making it more difficult to correct for spherical aberration although it is easier to correct for spherical aberration although it is easier to correct field dependent aberrations. If the ratio $|f_{G3}/L|$ is greater than 4.8 (holding the ratio $|f_{G2}/L|$ fixed) the beam expansion ratio decreases resulting in a more uniformly shaped lens system, however, the angular magnification increases making it more difficult to correct field dependent aberrations although it is easier to correct spherical aberration.

The projection exposure apparatus shown in FIG. 1A satisfies the condition:

$$0.05 < |f_{G2}/f_{G3}| < 0.25,$$

where $f_{G2}$ is the focal length of the second group of lens elements and $f_{G3}$ is the focal length of the third group of lens elements. The ratio $|f_{G2}/f_{G3}|$ for the embodiment shown in FIG. 1A is 0.16988. If the ratio $|f_{G2}/f_{G3}|$ is below the 0.05, the shape of the projection lens system is regular, however the correction of field aberrations is more difficult. If the ratio $|f_{G2}/f_{G3}|$ is above 0.25 the diameter of certain of the lens elements becomes large causing problems with the support structure, however, the field aberrations are easier to correct.

The projection exposure apparatus shown in FIG. 1A satisfies the condition:

$$0.77 < f_{G1}/f_{G4} < 1.1,$$

where $f_{G1}$ is the focal length of the first group of lens elements and $f_{G4}$ is the focal length of the fourth group of lens elements. The ratio $f_{G1}f_{G4}$ for the lens projection system shown in FIG. 1A is equal to 0.77232. If the ratio is under the lower limit or above the upper limit, the length of the projection lens system becomes too large, causing structural support problems for the projection lens system as a whole.

The projection exposure apparatus shown in FIG. 1A satisfies the conditions:

$$0.17 < f_{G4}/F < 0.195 \text{ and}$$

$$0.14 < f_{G1}/F < 0.191,$$

where $f_{G4}$ is the focal length of the fourth group of lens elements $G_4$, $f_{G1}$ is the focal length of the first group of lens elements $G_1$ and F is the overall focal length of the projection lens system. The ratio $f_{G4}/F=0.19096$ and $f_{G1}/F=0.14747$ for the embodiment shown in FIG. 1A. If the above ratios are above the ranges, the length of the projection lens system becomes too large, causing structural support problems for the projection lens system as a whole. If the above ratios are below the ranges, the correction of aberrations becomes more difficult.

The projection exposure apparatus shown in FIG. 1A satisfies the condition:

$$NA = n \sin\theta \geq 0.60,$$

where NA is the numerical aperture at the wafer side, n is the refractive index of the image space medium and θ is the angle between a marginal ray and the optical axis at the image plane. If the numerical aperture is below 0.60, the resolution becomes too low to accurately project high definition reticle images onto a wafer.

The second group of lens elements $G_2$ includes a first subgroup of lens elements $SG_{21}$, that includes at least three lens elements $L_6$, $L_7$ and $L_8$, each having a negative refractive power and a second subgroup of lens elements $SG_{22}$ that includes at least two lens elements $L_{11}$ and $L_{12}$ each having a positive refractive power.

The third group of lens elements $G_3$ includes a first subgroup of lens elements $SG_{31}$ that includes at least two lens elements $L_{13}$ and $L_{14}$ each having a positive refractive power, a second subgroup of lens elements $SG_{32}$ that includes at least two lens elements $L_{18}$ and $L_{19}$ each having a negative refractive power and a third subgroup of lens elements $SG_{33}$ that includes at least two lens elements $L_{21}$, and $L_{22}$ each having a positive refractive power.

The third group of lens elements $G_3$ includes an aperture stop 41 disposed between the second subgroup of lens elements in the third group of lens elements $SG_{32}$ and the third subgroup of lens elements in the third group of lens elements $SG_{33}$.

The fourth group of lens elements $G_4$ includes a first subgroup of lens elements $SG_{41}$, that includes a lens element $L_{24}$ having a positive refractive power and a meniscus lens element $L_{23}$ having a concave lens surface 47 facing lens element $L_{23}$. The fourth group of lens elements $G_4$ includes a second subgroup of lens elements $SG_{42}$ that includes a lens element $L_{28}$ having a negative refractive power and a third subgroup of lens elements $SG_{43}$ that includes a lens element $L_{31}$, having a positive refractive power.

Figure 1B:
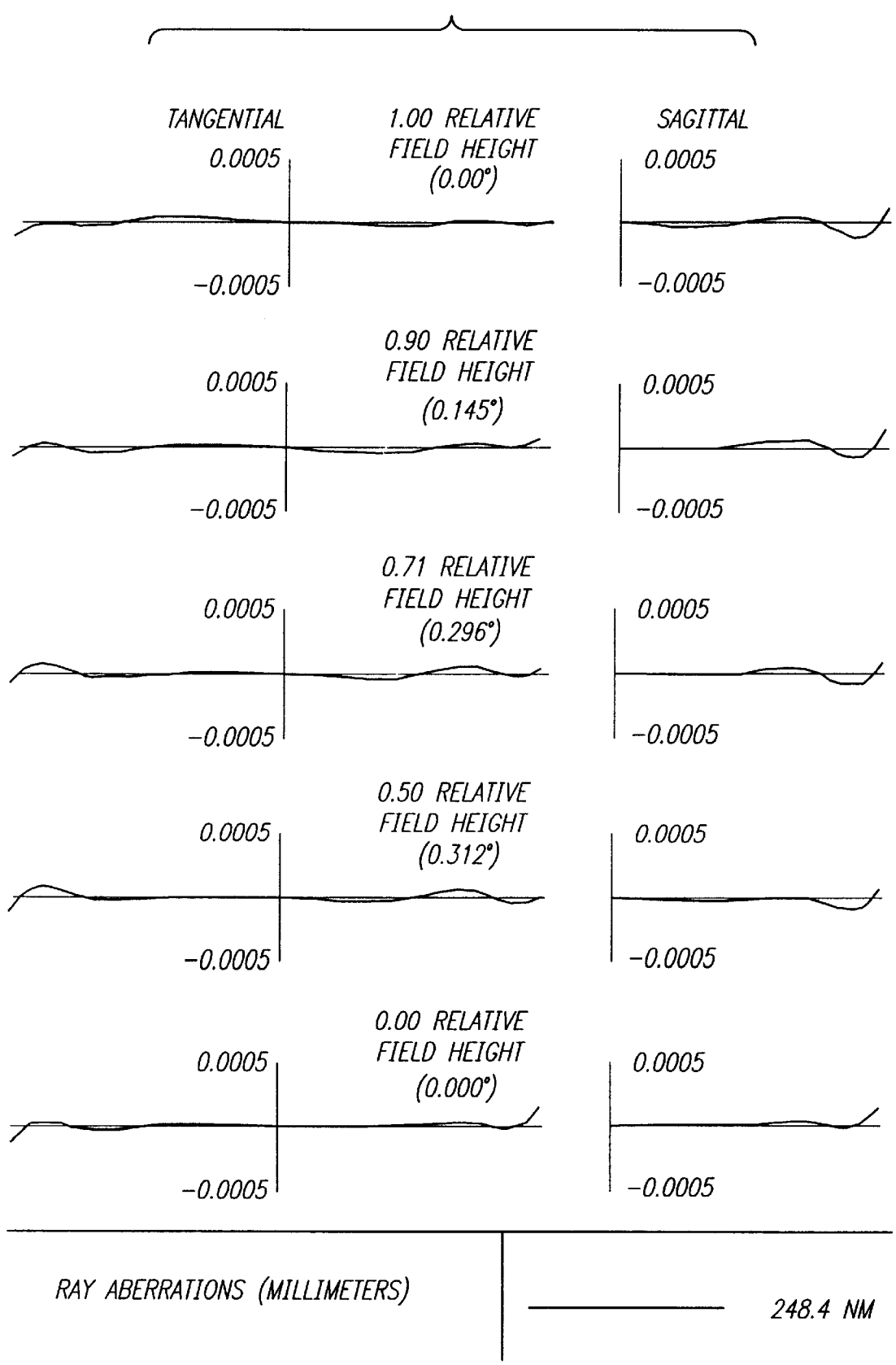
FIG. 1B shows the ray aberrations of the projection lens system shown in FIG. 1A for varying relative field heights all at a wavelength of 248.4 nanometers.

FIG. 1B shows the ray aberrations of the projection lens system of the first embodiment for varying relative field heights at a wavelength of 248.4 nanometers.

Figure 1C:
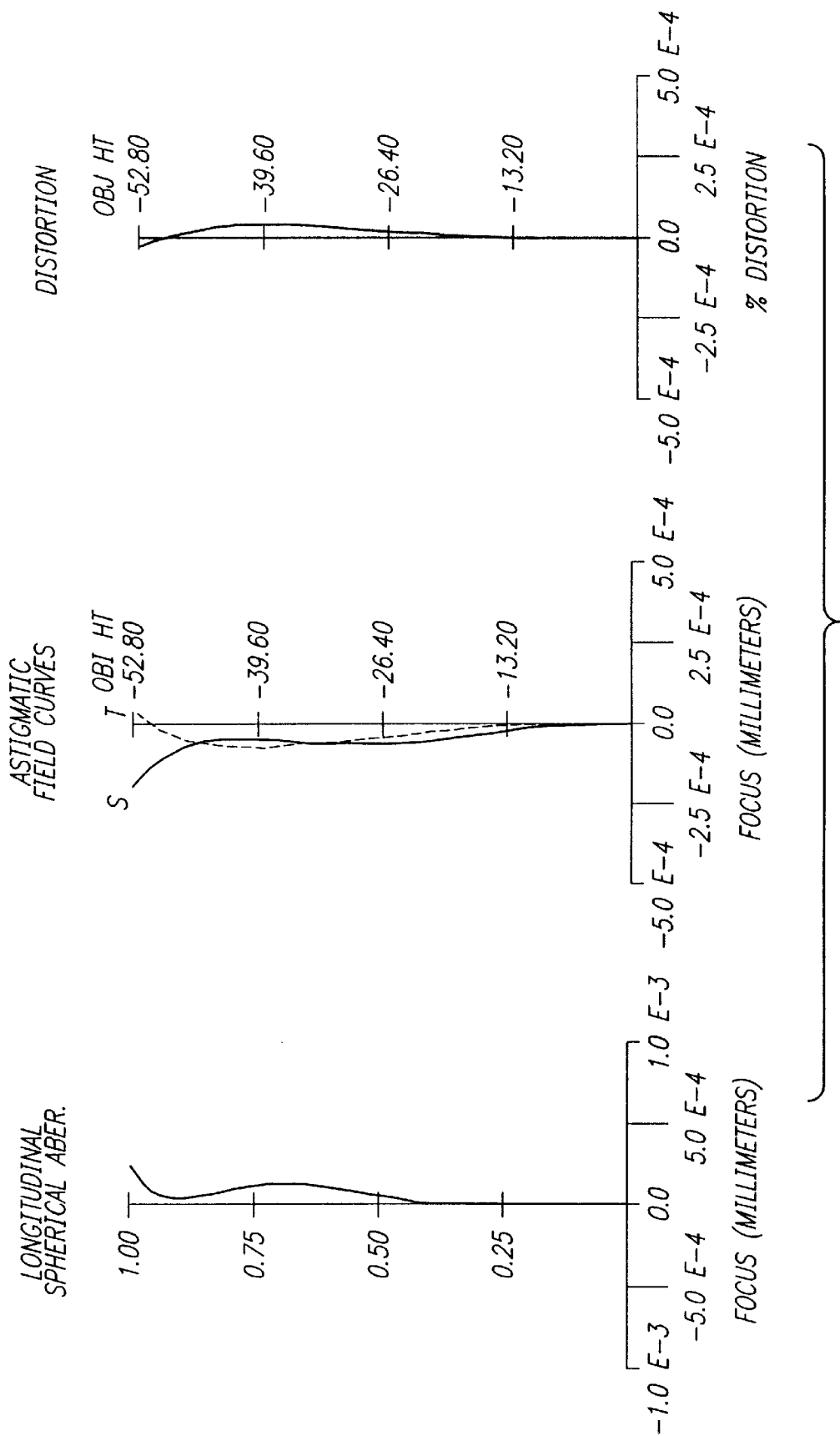
FIG. 1C shows the longitudinal spherical aberration, the astigmatic field curves, and the distortion of the projection lens system shown in FIG. 1A.

FIG. 1C shows the longitudinal spherical aberration, the astigmatic field curves, and the distortion of the projection lens system of the first embodiment. As will be appreciated by a person of ordinary skill in the optical art, the ray aberration diagrams shown in FIG. 1B indicate how the image quality of a lens system can affect the intended purpose of the lens system. A determination of the aberration content of the lens system can be obtained by an examination of the ray intercept plots for a lens system shown in FIG. 1B and an examination of the longitudinal plots of spherical aberration, astigmatism and distortion shown in FIG. 1C. In the ray intercept plots the ray displacements are plotted vertically as a function of the position of the ray in the aperture. The vertical scale is given at the lower end of the vertical bar for the axial plot; the number given is the half-length (i.e., from the origin to the end) of the vertical line in the plot. The horizontal scale is proportional to the tangent of the ray slope angle. In accordance with the usual convention, the upper ray of the ray fan is plotted to the right.

Table 1 below shows the values of specifications for the first embodiment described above. The numbers in the leftmost column indicate the order of optical surfaces from the object (reticle) side to the image (wafer) side, r is the curvature radius in millimeters of the lens surface (a positive radius indicates the center of curvature is towards the right or image side and a negative radius indicates the center of curvature is towards the left or reticle side), and d is the axial distance in millimeters to the next lens surface.

The optical material used in all lens elements in Table 1 is fused silica ($SiO_2$) having a refractive index of 1.508379 at a wavelength of 248.2 nanometers. As can be appreciated by one of ordinary skill in the art, the refractive index can vary slightly depending upon the grade of silica from which the lens elements are manufactured and also depends upon the capability of the manufacturer of the lens material.

TABLE 1

Object plane to first optical surface = 92.999153 mm
Last optical surface to image plane = 16.999911 mm
$f_{G1}$ = 127.07 mm, $f_{G2}$ = −316.25 mm, $f_{G3}$ = 1861.60 mm, $f_{G4}$ = 164.53 mm
F = 861.61 mm, L = 1000 mm.
Refractive index of all glass elements @248.4 nanometers = 1.508379.
NA = 0.60, 4× Reduction, Exposure field size = 26.4 mm diameter.

| Surface number | Radius of curvature (mm) | axial distance (mm) | Optical material |
|---|---|---|---|
| OBJ | INFINITY | 92.999153 | |
| 1 | 487.09105 | 15.892489 | silica |
| 2 | 301.00614 | 7.897242 | air |
| 3 | 486.79059 | 21.805761 | silica |
| 4 | −368.41049 | 1.298876 | air |
| 5 | 340.15050 | 21.562899 | silica |
| 6 | −606.00292 | 1.333304 | air |
| 7 | 287.07548 | 21.350347 | silica |
| 8 | INFINITY | 2.883904 | air |
| 9 | 225.35169 | 20.352133 | silica |
| 10 | −1279.78956 | 0.500000 | air |
| 11 | INFINITY | 12.500000 | silica |
| 12 | 83.69915 | 19.563556 | air |
| 13 | −581.88932 | 11.000000 | silica |
| 14 | 119.62709 | 20.626759 | air |
| 15 | −138.08340 | 12.500000 | silica |
| 16 | INFINITY | 20.147075 | air |
| 17 | −189.97235 | 12.500000 | silica |
| 18 | INFINITY | 5.756002 | air |
| 19 | −448.27193 | 19.796294 | silica |
| 20 | −185.83886 | 0.500391 | air |
| 21 | 1188.90184 | 27.652354 | silica |
| 22 | −245.34693 | 0.513616 | air |
| 23 | 541.85415 | 30.699496 | silica |
| 24 | −308.13518 | 0.500000 | air |
| 25 | 1603.53579 | 18.590243 | silica |
| 26 | −647.51660 | 0.500000 | air |

TABLE 1-continued

Object plane to first optical surface = 92.999153 mm
Last optical surface to image plane = 16.999911 mm
$f_{G1}$ = 127.07 mm, $f_{G2}$ = −316.25 mm, $f_{G3}$ = 1861.60 mm, $f_{G4}$ = 164.53 mm
F = 861.61 mm, L = 1000 mm.
Refractive index of all glass elements @248.4 nanometers = 1.508379.
NA = 0.60, 4× Reduction, Exposure field size = 26.4 mm diameter.

| Surface number | Radius of curvature (mm) | axial distance (mm) | Optical material |
|---|---|---|---|
| 27 | 319.90950 | 21.850221 | silica |
| 28 | INFINITY | 0.500000 | air |
| 29 | 189.11116 | 29.678177 | silica |
| 30 | −1305.76416 | 0.500000 | air |
| 31 | INFINITY | 15.000000 | silica |
| 32 | 284.58304 | 8.252965 | air |
| 33 | INFINITY | 12.500000 | silica |
| 34 | 132.54704 | 23.813045 | air |
| 35 | −181.48826 | 12.500000 | silica |
| 36 | 185.73563 | 27.365292 | air |
| 37 | −120.28443 | 12.500000 | silica |
| 38 | INFINITY | 16.948283 | air |
| 39 | −289.66928 | 19.626770 | silica |
| 40 | −167.05438 | 18.247935 | air |
| 41 (STOP) | INFINITY | 16.746374 | air |
| 42 | −2544.99909 | 25.778251 | silica |
| 43 | −275.55398 | 0.500101 | air |
| 44 | 2620.83004 | 37.000000 | silica |
| 45 | −259.57582 | 0.500000 | air |
| 46 | 356.94647 | 18.000000 | silica |
| 47 | 255.51496 | 9.132565 | air |
| 48 | 325.19248 | 37.859082 | silica |
| 49 | −484.35641 | 0.500000 | air |
| 50 | 146.81336 | 42.495143 | silica |
| 51 | 551.59386 | 0.500000 | air |
| 52 | 119.86933 | 26.207416 | silica |
| 53 | 172.25963 | 0.500000 | air |
| 54 | 129.87879 | 19.002139 | silica |
| 55 | 144.60889 | 18.080609 | air |
| 56 | 387.53161 | 12.859402 | silica |
| 57 | 64.84873 | 12.234875 | air |
| 58 | 124.95076 | 22.804725 | silica |
| 59 | −908.62073 | 5.111518 | air |
| 60 | INFINITY | 10.000000 | silica |
| 61 | 73.53635 | 0.500000 | air |
| 62 | 52.54759 | 27.183222 | silica |
| 63 | INFINITY | 16.999911 | air |
| IMG | INFINITY | 0.000000 | |

Where $f_{G1}$ is the focal length of the first group of lens element $G_1$, $f_{G2}$ is the focal length of the second group of lens elements $G_2$, $f_{G3}$ is the focal length of the third group of lens elements $G_3$, and $f_{G4}$ is the focal length of the fourth group of lens elements $G_4$. F is the overall focal length of the projection lens system and L is the overall length of the projection lens system (from the reticle plane to the wafer plane).

Figure 2A:
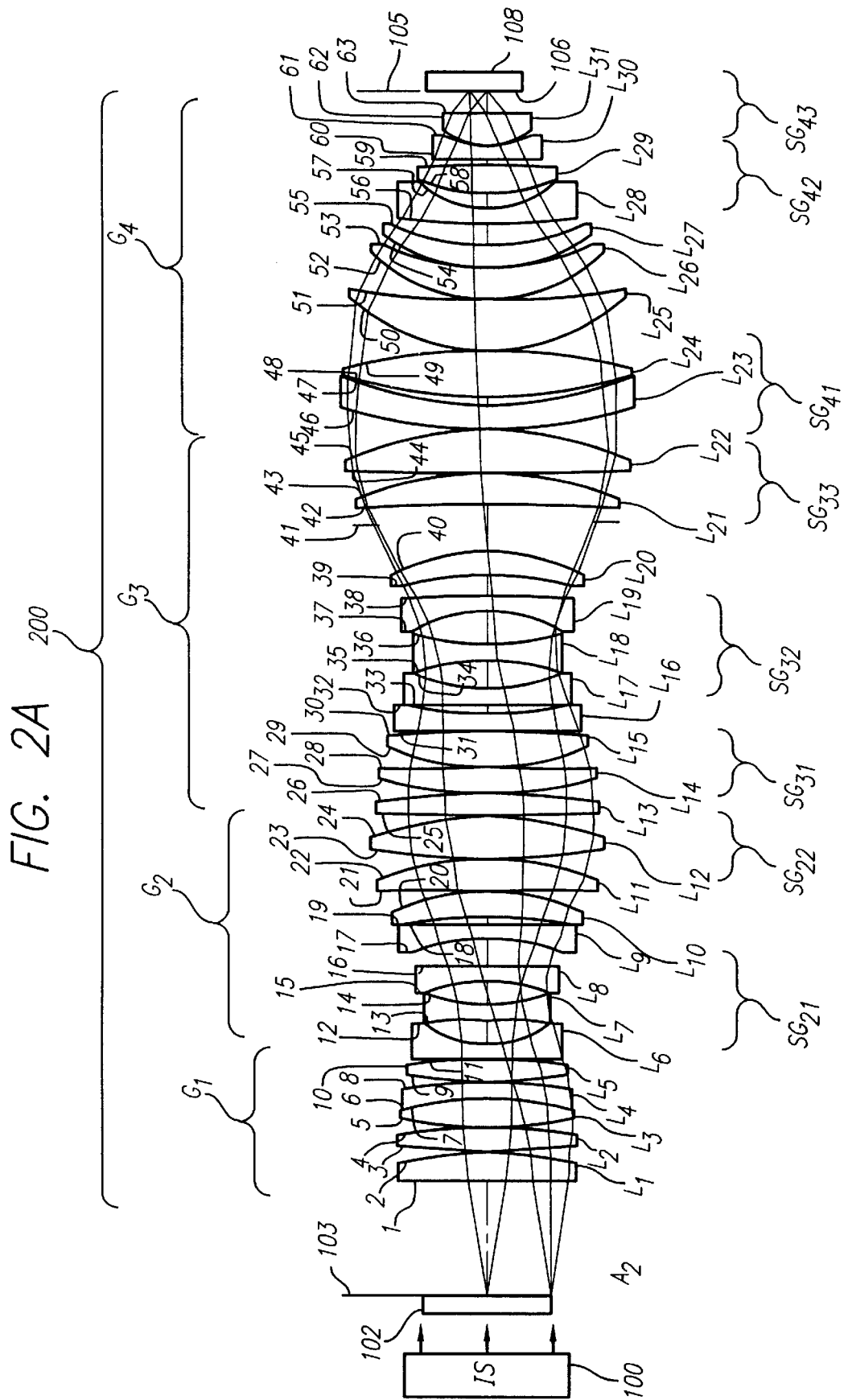
FIG. 2A is a schematic diagram of a projection lens system according to a second embodiment of the present invention.

Referring to FIG. 2A, there is shown a second embodiment of a projection lens system in accordance with the present invention. The projection lens system 200 viewed from the object side, in order of succession, includes a first group of lens elements $G_1$ with an overall positive refractive power, a second group of lens elements $G_2$ with an overall negative refractive power, a third group of lens elements $G_3$ with an overall positive refractive power, and a fourth group of lens elements $G_4$ with an overall positive refractive power. An aperture stop 41 is disposed in the third group of lens elements.

The projection exposure apparatus shown in FIG. 2A satisfies the conditions:

$0.3 < |f_{G2}/L| < 0.46$ and $1.8 < |f_{G3}/L| < 4.8$, where $f_{G2}$ is the focal length of the second group of lens elements $G_2$, $f_{G3}$ is the focal length of the third group of lens elements $G_3$, and L is axial distance measured along the optical axis AX from the object plane 103 to the wafer plane 105. In the embodiment shown in FIG. 2A, $f_{G2}/L=0.4587$ and $f_{G3}/L=1.848$. The consequences of the ratios being outside the above ranges are described above in conjunction with the embodiment shown in FIG. 1A.

The projection exposure apparatus shown in FIG. 2A satisfies the condition:

$$0.05<|f_{G2}/f_{G3}|<0.25,$$

where $f_{G2}$ is the focal length of the second group of lens elements and $f_{G3}$ is the focal length of the third group of lens elements. The ratio $|f_{G2}/f_{G3}|$ for the embodiment shown in FIG. 2A is 0.24782. If the ratio $|f_{G2}/f_{G3}|$ is below the 0.05, the shape of the projection lens system is regular, however the correction of field aberrations is more difficult. If the ratio $|f_{G2}/f_{G3}|$ is above 0.25 the diameter of certain of the lens elements becomes large causing problems with the support structure, however, the field aberrations are easier to correct.

The projection exposure apparatus shown in FIG. 2A satisfies the condition:

$$0.77<f_{G1}/f_{G4}<1.1,$$

where $f_{G1}$ is the focal length of the first group of lens elements and $f_{G4}$ is the focal length of the fourth group of lens elements. The ratio $f_{G1}/f_{G4}$ for the lens projection system shown in FIG. 2A is equal to 0.79063. If the ratio is under the lower limit or above the upper limit, the length of the projection lens system becomes too large, causing structural support problems for the projection lens system as a whole.

The projection exposure apparatus shown in FIG. 2A satisfies the conditions:

$$0.17<f_{G4}/F<0.195 \text{ and}$$

$$0.14<f_{G1}/F<0.191,$$

where $f_{G4}$ is the focal length of the fourth group of lens elements $G_4$, $f_{G1}$ is the focal length of the first group of lens elements $G_1$ and F is the overall focal length of the projection lens system. The ratio $f_{G4}/F=0.19405$ and $f_{G1}/F=0.15342$ for the embodiment shown in FIG. 2A. If the above ratios are above the ranges, the length of the projection lens system becomes too large, causing structural support problems for the projection lens system as a whole. If the above ratios are below the ranges, the correction of aberrations becomes more difficult.

The projection exposure apparatus shown in FIG. 2A satisfies the condition:

$$NA = n \sin \theta \geq 0.60,$$

where NA is the numerical aperture at the wafer side, n is the refractive index of the image space medium and θ is the angle between a marginal ray and the optical axis at the image plane. If the numerical aperture is below 0.60, the resolution becomes too low to accurately project high definition reticle images onto a wafer.

The second group of lens elements $G_2$ includes a first subgroup of lens elements $SG_{21}$ that includes at least three lens elements $L_6$, $L_7$ and $L_8$, each having a negative refractive power and a second subgroup of lens elements $SG_{22}$ that includes at least two lens elements $L_{11}$ and $L_{12}$ each having a positive refractive power.

The third group of lens elements $G_3$ includes a first subgroup of lens elements $SG_{31}$, that includes at least two lens elements $L_{13}$ and $L_{14}$ each having a positive refractive power, a second subgroup of lens elements $SG_{32}$ that includes at least two lens elements $L_{18}$ and $L_{19}$ each having a negative refractive power and a third subgroup of lens elements $SG_{33}$ that includes at least two lens elements $L_{21}$ and $L_{22}$ each having a positive refractive power.

The third group of lens elements $G_3$ includes an aperture stop 41 disposed between the second subgroup of lens elements in the third group of lens elements $SG_{32}$ and the third subgroup of lens elements in the third subgroup of lens elements in the third group of lens elements $SG_{33}$.

The fourth group of lens elements $G_4$ includes a first subgroup of lens elements $SG_{41}$, that includes a lens element $L_{24}$ having a positive refractive power and a meniscus lens element $L_{23}$ having a concave lens surface 47 facing lens element $L_{23}$. The fourth group of lens elements $G_4$ includes a second subgroup of lens elements $SG_{42}$ that includes a lens element $L_{28}$ having a negative refractive power and a third subgroup of lens elements $SG_{43}$ that includes a lens element $L_{31}$, having a positive refractive power.

Figure 2B:
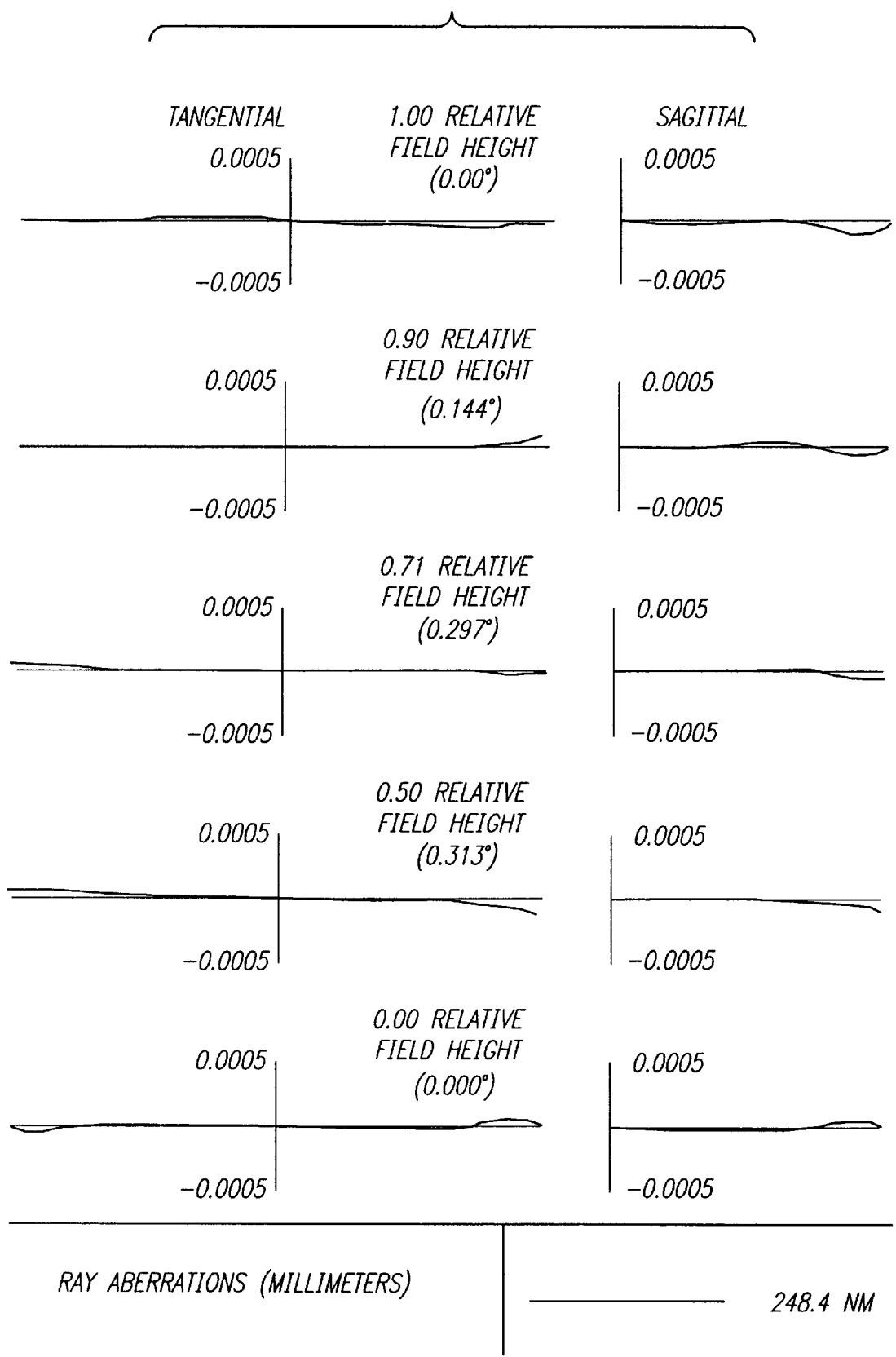
FIG. 2B shows the ray aberrations of the projection lens system shown in FIG. 2A for varying relative field heights all at a wavelength of 248.4 nanometers.

FIG. 2B shows the ray aberrations of the projection lens system of the second embodiment for varying relative field heights at a wavelength of 248.4 nanometers.

Figure 2C:
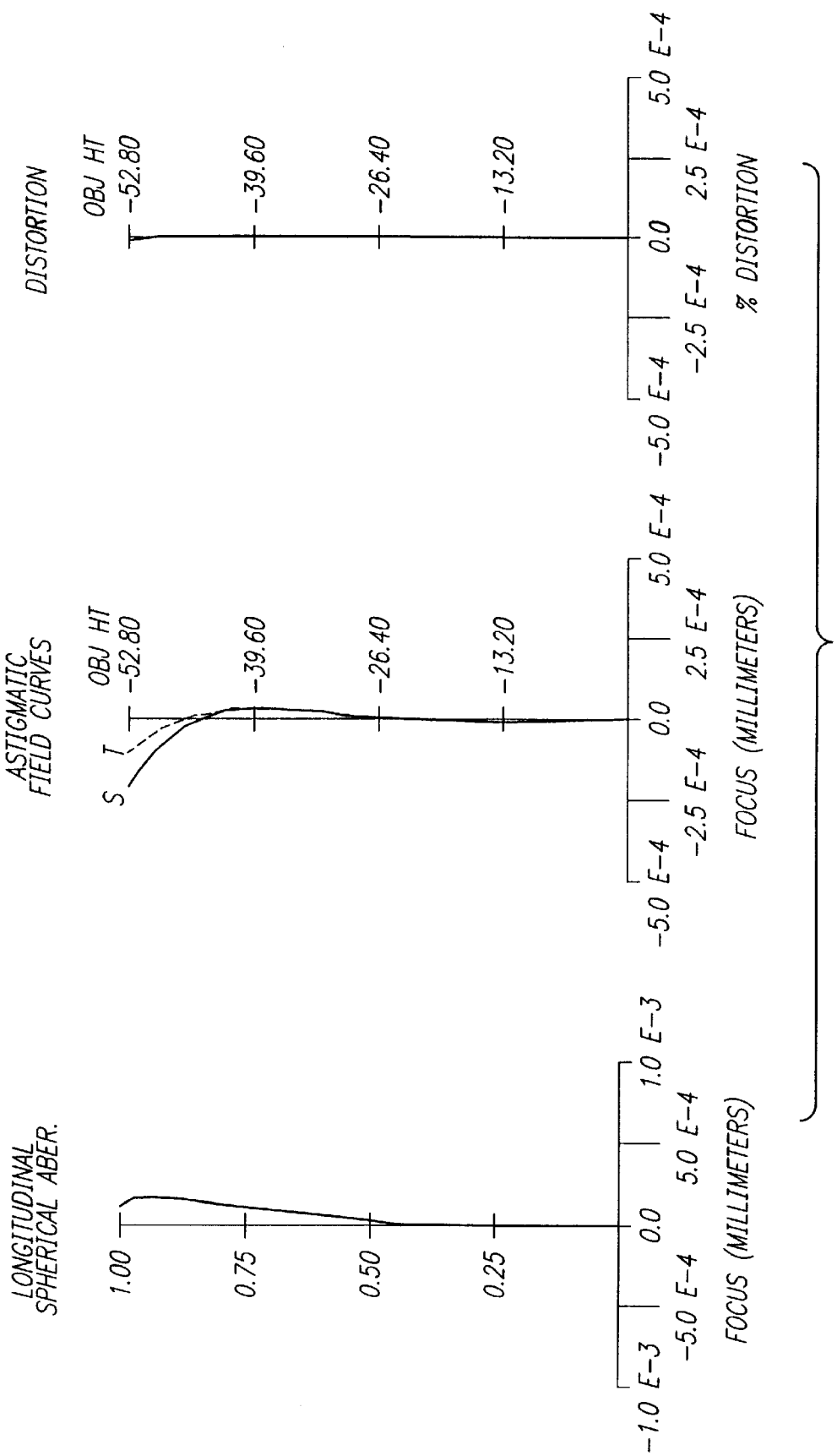
FIG. 2C shows the longitudinal spherical aberration, the astigmatic field curves, and the distortion of the projection lens systems shown in FIG. 2A.

FIG. 2C shows the longitudinal spherical aberration, the astigmatic field curves, and the distortion of the projection lens system of the second embodiment.

The significance of the ray aberration diagrams, astigmatic field curves and distortion shown in FIGS. 2B & 2C is described above in relation to the discussion of FIGS. 1B & 1C.

Table 2 below shows the values of specifications for the second embodiment described above. The parameters are the same as described above for Table 1.

TABLE 2

Object plane to first optical surface = 93.000141 mm
Last optical surface to image plane = 16.999929 mm
$f_{G1}$ = 131.75 mm, $f_{G2}$ = −458.07 mm, $f_{G3}$ = 1848.41 mm, $f_{G4}$ = 166.64 mm
F = 858.75 mm, L = 1000 mm.
Refractive index of all glass elements @248.4 nanometers = 1.508379
NA = 0.60, 4× Reduction, Exposure field size = 26.4 mm diameter

| Surface number | Radius of curvature (mm) | axial distance (mm) | Optical material |
|---|---|---|---|
| OBJ | INFINITY | 93.000141 | |
| 1 | INFINITY | 22.730656 | silica |
| 2 | −348.22215 | 0.927615 | air |
| 3 | 398.79364 | 20.579296 | silica |
| 4 | −581.53986 | 0.619113 | air |
| 5 | 272.40981 | 23.572987 | silica |
| 6 | −438.22424 | 2.029472 | air |
| 7 | −335.26916 | 12.500000 | silica |
| 8 | −899.84281 | 0.539164 | air |
| 9 | 268.78253 | 19.433439 | silica |
| 10 | −724.85365 | 0.500000 | air |
| 11 | INFINITY | 12.500000 | silica |
| 12 | 85.12202 | 18.656650 | air |
| 13 | −664.96082 | 11.000000 | silica |
| 14 | 123.69106 | 19.866522 | air |
| 15 | −136.08667 | 12.500000 | silica |
| 16 | INFINITY | 24.269380 | air |
| 17 | −194.98556 | 12.500000 | silica |
| 18 | INFINITY | 5.661843 | air |
| 19 | −475.41610 | 19.923820 | silica |
| 20 | −190.30869 | 1.484480 | air |

TABLE 2-continued

Object plane to first optical surface = 93.000141 mm
Last optical surface to image plane = 16.999929 mm
$f_{G1}$ = 131.75 mm, $f_{G2}$ = −458.07 mm, $f_{G3}$ = 1848.41 mm, $f_{G4}$ = 166.64 mm
F = 858.75 mm, L = 1000 mm.
Refractive index of all glass elements @248.4 nanometers = 1.508379
NA = 0.60, 4× Reduction, Exposure field size = 26.4 mm diameter

| Surface number | Radius of curvature (mm) | axial distance (mm) | Optical material |
| --- | --- | --- | --- |
| 21 | 1288.57800 | 28.947007 | silica |
| 22 | −234.25074 | 0.520280 | air |
| 23 | 633.57789 | 31.713881 | silica |
| 24 | −280.90539 | 0.500000 | air |
| 25 | 743.17377 | 18.515699 | silica |
| 26 | −1319.53706 | 0.500000 | air |
| 27 | 326.05469 | 21.838808 | silica |
| 28 | INFINITY | 0.500000 | air |
| 29 | 182.52177 | 30.090500 | silica |
| 30 | −1644.04641 | 0.500000 | air |
| 31 | INFINITY | 12.500000 | silica |
| 32 | 279.99433 | 8.565043 | air |
| 33 | INFINITY | 12.500000 | silica |
| 34 | 125.72991 | 25.178990 | air |
| 35 | −175.79443 | 12.500000 | silica |
| 36 | 191.70845 | 28.866473 | air |
| 37 | −126.73258 | 12.500000 | silica |
| 38 | INFINITY | 17.361655 | air |
| 39 | −301.59039 | 20.648121 | silica |
| 40 | −175.00354 | 19.357628 | air |
| 41 (STOP) | INFINITY | 16.452562 | air |
| 42 | −3151.52899 | 26.151894 | silica |
| 43 | −281.96664 | 0.500000 | air |
| 44 | 1703.96335 | 37.000000 | silica |
| 45 | −268.67190 | 0.500000 | air |
| 46 | 369.87688 | 18.000000 | silica |
| 47 | 223.66580 | 10.037497 | air |
| 48 | 334.59631 | 37.859082 | silica |
| 49 | −486.17073 | 0.500000 | air |
| 50 | 147.19273 | 42.495143 | silica |
| 51 | 559.71460 | 0.500000 | air |
| 52 | 126.02818 | 25.949520 | silica |
| 53 | 186.46087 | 0.500000 | air |
| 54 | 126.28361 | 18.000337 | silica |
| 55 | 143.95233 | 18.678880 | air |
| 56 | 423.71558 | 12.518080 | silica |
| 57 | 66.16686 | 12.505721 | air |
| 58 | 132.07330 | 23.776208 | silica |
| 59 | −764.01444 | 5.056036 | air |
| 60 | INFINITY | 10.000000 | silica |
| 61 | 75.38687 | 0.500000 | air |
| 62 | 53.64362 | 27.120375 | silica |
| 63 | INFINITY | 16.999929 | air |
| IMG | INFINITY | 0.000000 | |

Where the parameter definitions are the same as described for Table 1.

Figure 3A:
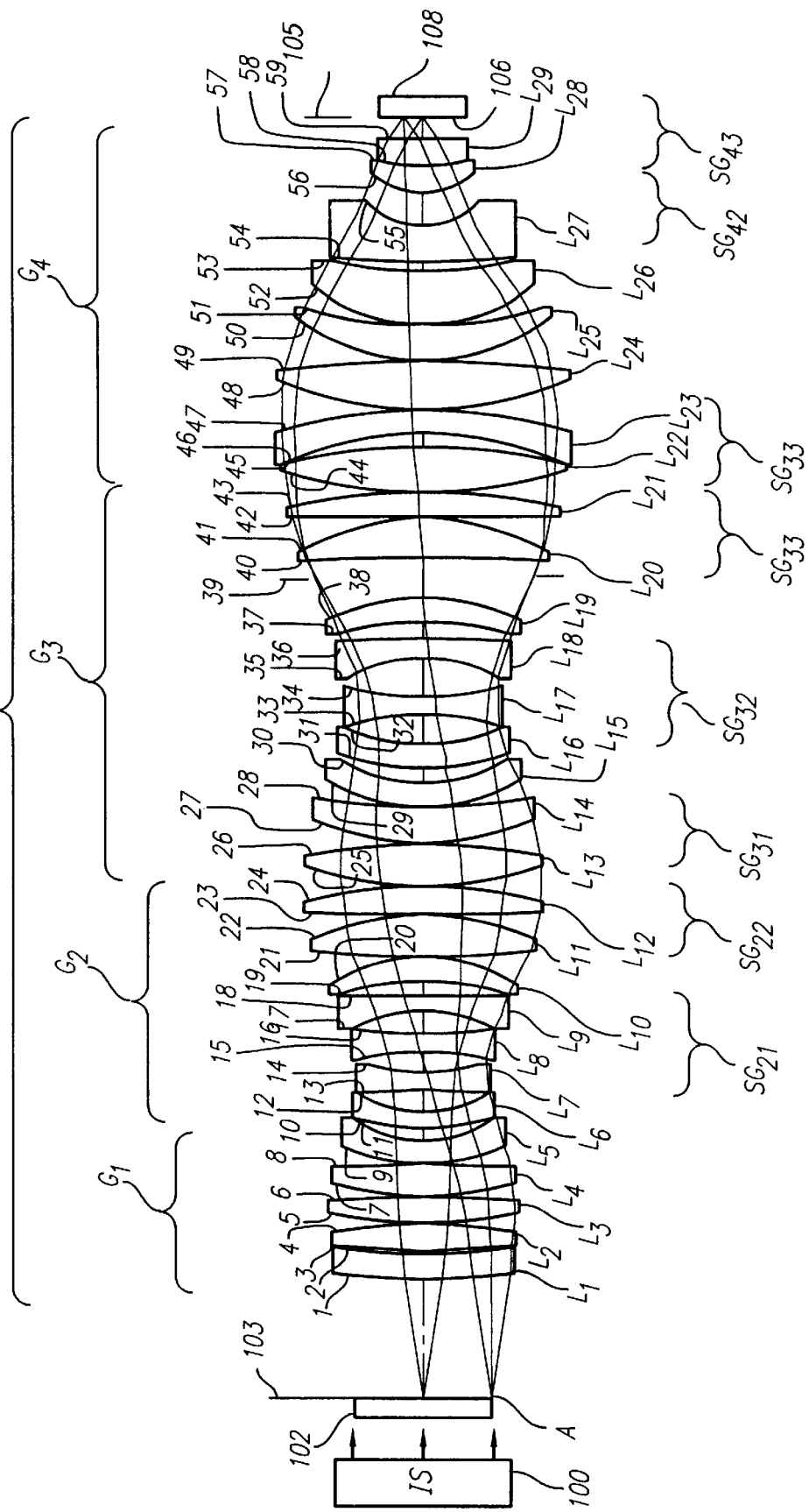
FIG. 3A is a schematic diagram of a projection lens system according to a third embodiment of the present invention.

Referring to FIG. 3A, a third embodiment of a projection lens system in accordance with the present invention is shown. The projection lens system 300, viewed from the object side, in order of succession, includes a first group of lens elements $G_1$ with an overall positive refractive power, a second group of lens elements $G_2$ with an overall negative refractive power, a third group of lens elements $G_3$ with a an overall positive refractive power, and a fourth group of lens elements $G_4$ with an overall positive refractive power. An aperture stop 39 is disposed in third group of lens elements.

The projection exposure apparatus shown in FIG. 3A satisfies the conditions:

$$0.3 < |f_{G2}/L| < 0.46 \text{ and}$$

$$1.8 < |f_{G3}/L| < 4.8,$$

where $f_{G2}$ is the focal length of the second group of lens elements $G_2$, $f_{G3}$ is the focal length of the third group of lens elements $G_3$, and L is axial distance measured along the optical axis AX from the object plane 103 to the wafer plane 105. In the embodiment shown in FIG. 3A, $f_{G2}/L = 0.26182$ and $f_{G3}/L = 4.7359$. The consequences of the ratios being outside the above ranges are described above in conjunction with the embodiment shown in FIG. 1A.

The projection exposure apparatus shown in FIG. 3A satisfies the condition:

$$0.05 < |f_{G2}/f_{G3}| < 0.25,$$

where $f_{G2}$ is the focal length of the second group of lens elements and $f_{G3}$ is the focal length of the third group of lens elements. The ratio $|f_{G2}/f_{G3}|$ for the embodiment shown in FIG. 3A is 0.05528. If the ratio $|f_{G2}/f_{G3}|$ is below the 0.05, the shape of the projection lens system is regular, however the correction of field aberrations is more difficult. If the ratio $|f_{G2}/f_{G3}|$ is above 0.25 the diameter of certain of the lens elements becomes large causing problems with the support structure, however, the field aberrations are easier to correct.

The projection exposure apparatus shown in FIG. 3A satisfies the condition:

$$0.77 < f_{G1}/f_{G4} < 1.1,$$

where $f_{G1}$ is the focal length of the first group of lens elements and $f_{G4}$ is the focal length of the fourth group of lens elements. The ratio $f_{G1}/f_{G4}$ for the lens projection system shown in FIG. 3A is equal to 1.08646. If the ratio is under the lower limit or above the upper limit, the length of the projection lens system becomes too large, causing structural support problems for the projection lens system as a whole.

The projection exposure apparatus shown in FIG. 3A satisfies the conditions:

$$0.17 < f_{G4}/F < 0.195 \text{ and}$$

$$0.14 < f_{G1}/F < 0.191,$$

where $f_{G4}$ is the focal length of the fourth group of lens elements $G_4$, $f_{G1}$ is the focal length of the first group of lens elements $G_1$ and F is the overall focal length of the projection lens system. The ratio $f_{G4}/F = 0.1752$ and $f_{G1}/F = 0.19032$ for the embodiment shown in FIG. 3A. If the above ratios are above the ranges, the length of the projection lens system becomes too large, causing structural support problems for the projection lens system as a whole. If the above ratios are below the ranges, the correction of aberrations becomes more difficult.

The projection exposure apparatus shown in FIG. 3A satisfies the condition:

$$NA = n \sin\theta \geq 0.60,$$

where NA is the numerical aperture at the wafer side, n is the refractive index of the image space medium and θ is the angle between a marginal ray and the optical axis at the image plane. If the numerical aperture is below 0.60, the resolution becomes too low to accurately project high definition reticle images onto a wafer.

The second group of lens elements $G_2$ includes a first subgroup of lens elements $SG_{21}$, that includes at least three lens elements $L_7$, $L_8$ and $L_9$, each having a negative refractive power and a second subgroup of lens elements $SG_{22}$ that includes at least two lens elements $L_{11}$ and $L_{12}$ each having a positive refractive power.

The third group of lens elements $G_3$ includes a first subgroup of lens elements $SG_{31}$, that includes at least two lens elements $L_{13}$ and $L_{14}$ each having a positive refractive power, a second subgroup of lens elements $SG_{32}$ that includes at least two lens elements $L_{17}$ and $L_{18}$, each having a negative refractive power, and a third subgroup of lens elements $SG_{33}$ that includes at least two lens elements $L_{20}$ and $L_{21}$ each having a positive refractive power.

The third group of lens elements $G_3$ includes an aperture stop 39 disposed between the second subgroup of lens elements in the third group of lens elements $SG_{32}$ and the third subgroup of lens elements in the third subgroup of lens elements in the third group of lens elements $SG_{33}$.

The fourth group of lens elements $G_4$ includes a first subgroup of lens elements $SG_{41}$, that includes a lens element $L_{22}$ having a positive refractive power and a meniscus lens element $L_{23}$ having a concave lens surface 46 facing lens element $L_{22}$. The fourth group of lens elements $G_4$ includes a second subgroup of lens elements $SG_{42}$ that includes a lens element $L_{27}$ having a negative refractive power and a third subgroup of lens elements $SG_{43}$ that includes a lens element $L_{29}$ having a positive refractive power.

Figure 3B:
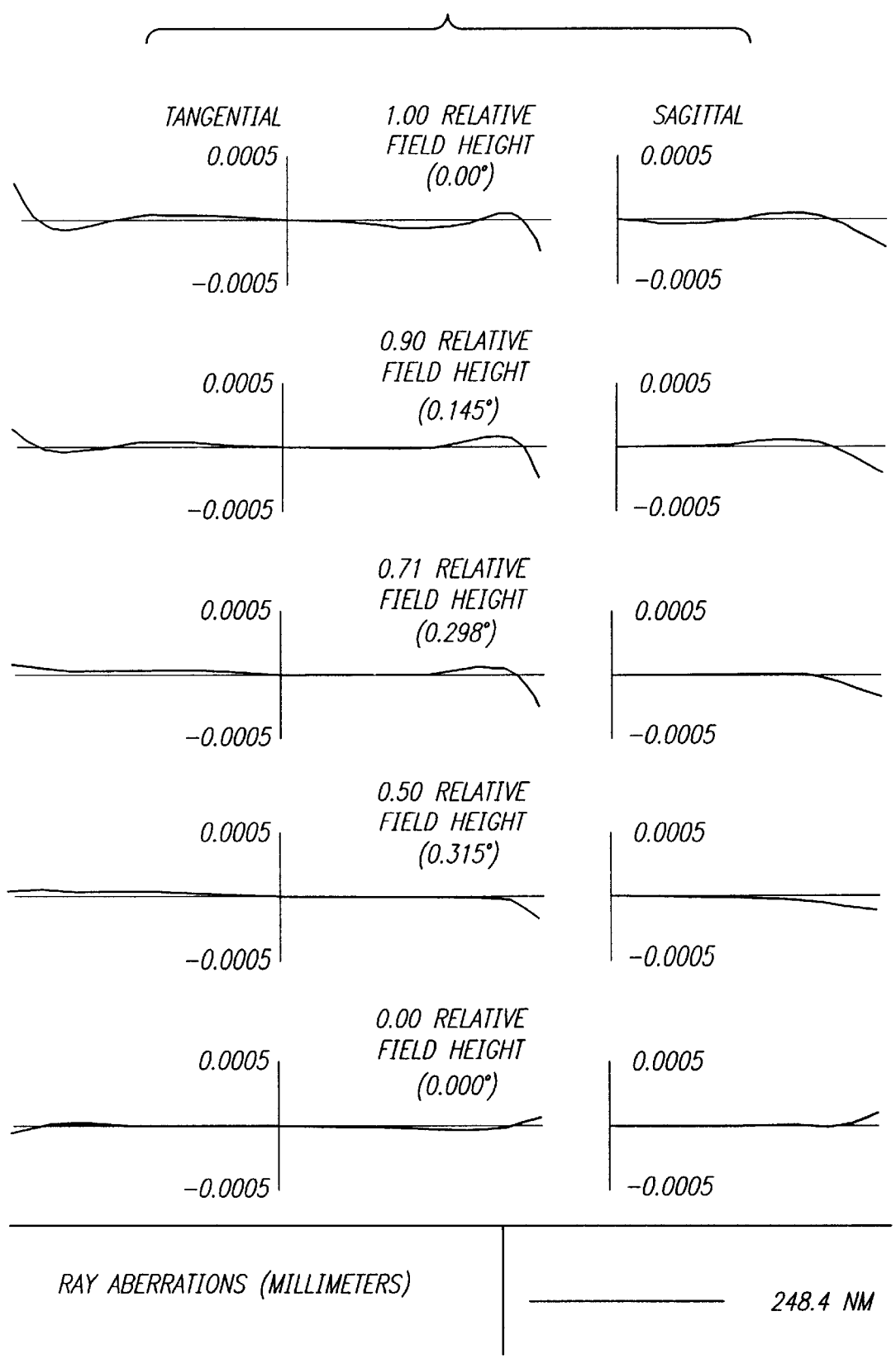
FIG. 3B shows the ray aberrations of the projection lens system shown in FIG. 3A for varying relative field heights all at a wavelength of 248.4 nanometers.

FIG. 3B shows the ray aberrations of the projection lens system of the third embodiment for varying relative field heights at a wavelength of 248.4 nanometers.

Figure 3C:
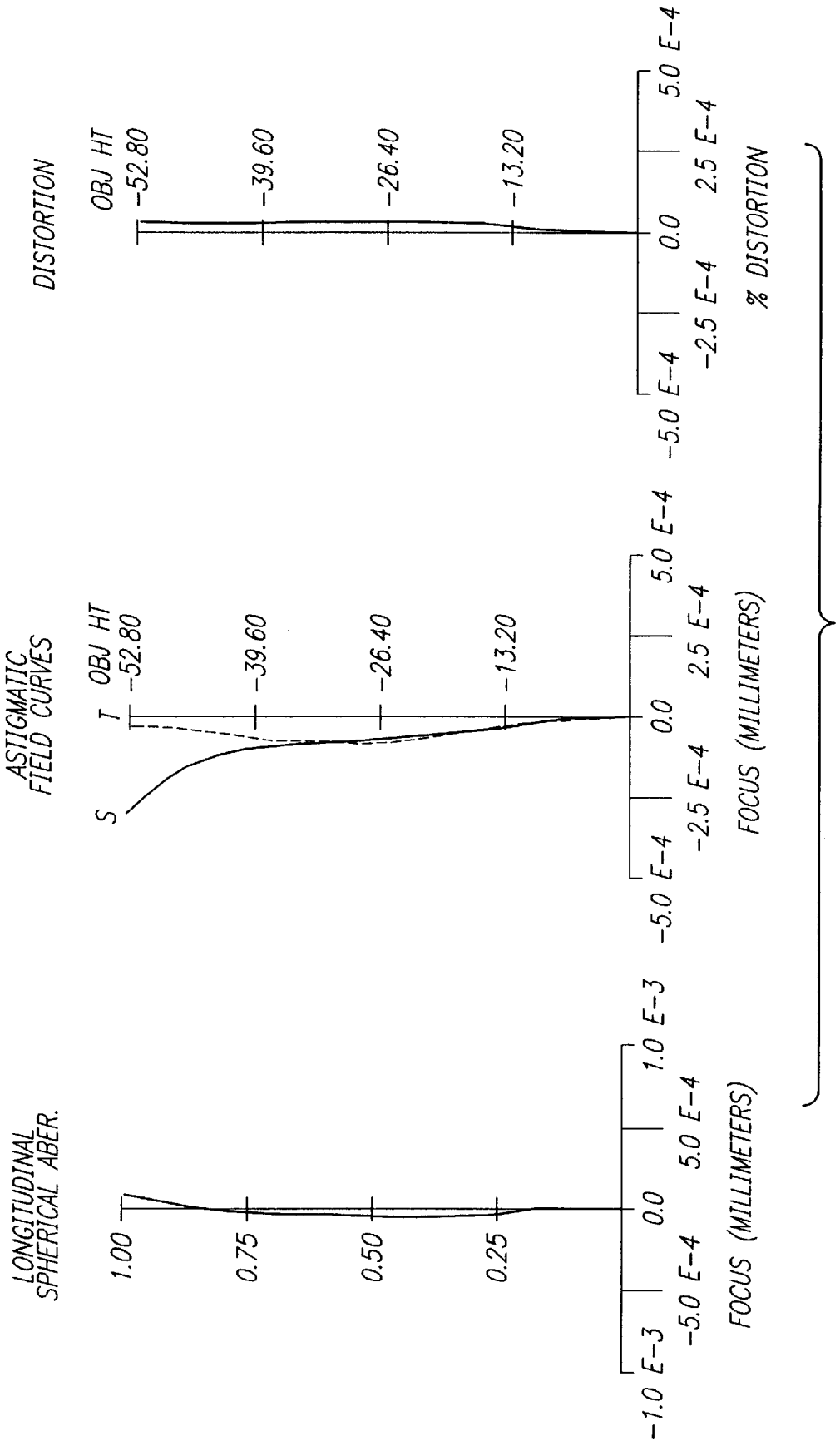
FIG. 3C shows the longitudinal spherical aberration, the astigmatic field curves, and the distortion of the projection lens systems shown in FIG. 3A.

FIG. 3C shows the longitudinal spherical aberrations, the astigmatic field curves, and the distortion of the projection lens system of the third embodiment.

The significance of the ray aberration diagrams, astigmatic field curves and distortion shown in FIGS. 3B & 3C is described above in relation to the discussion of FIGS. 1B & 1C.

Table 3 below shows the values of specifications for the third embodiment described above. The parameters are the same as described above for Table 1.

TABLE 3

Object plane to first optical surface = 92.998441 mm
Last optical surface to image plane = 16.680533 mm
$f_{G1}$ = 163.23 mm, $f_{G2}$ = −261.82 mm, $f_{G3}$ = 4735.90 mm, $f_{G4}$ = 150.24 mm
F = 857.64 mm, L = 1000 mm
Refractive index of all glass elements = 1.508379 at a wavelength of 248.4 nanometers
NA = 0.60, 4× Reduction, Exposure field size = 26.4 mm diameter

| Surface number | Radius of curvature (mm) | Axial distance (mm) | Optical material |
|---|---|---|---|
| OBJ | INFINITY | 92.999441 | |
| 1 | 702.45609 | 18.000000 | silica |
| 2 | 292.57435 | 4.352963 | air |
| 3 | 546.05451 | 21.169584 | silica |
| 4 | −365.76054 | 0.500000 | air |
| 5 | 324.86938 | 19.817241 | silica |
| 6 | −1291.26179 | 0.500000 | air |
| 7 | 208.97191 | 24.835112 | silica |
| 8 | −800.15862 | 0.500050 | air |
| 9 | 155.87832 | 18.000000 | silica |
| 10 | 85.95118 | 10.043502 | air |
| 11 | 155.37620 | 12.500000 | silica |
| 12 | 97.44176 | 16.116339 | air |
| 13 | −820.30250 | 13.030556 | silica |
| 14 | 165.47092 | 16.254567 | air |
| 15 | −225.33489 | 14.313200 | silica |
| 16 | 434.81553 | 17.557234 | air |
| 17 | −128.90823 | 12.958496 | silica |
| 18 | −1571.40742 | 11.041198 | air |
| 19 | −219.83121 | 18.000618 | silica |
| 20 | −149.72626 | 0.534009 | air |
| 21 | 547.43406 | 34.195779 | silica |

TABLE 3-continued

Object plane to first optical surface = 92.998441 mm
Last optical surface to image plane = 16.680533 mm
$f_{G1}$ = 163.23 mm, $f_{G2}$ = −261.82 mm, $f_{G3}$ = 4735.90 mm, $f_{G4}$ = 150.24 mm
F = 857.64 mm, L = 1000 mm
Refractive index of all glass elements = 1.508379 at a wavelength of 248.4 nanometers
NA = 0.60, 4× Reduction, Exposure field size = 26.4 mm diameter

| Surface number | Radius of curvature (mm) | Axial distance (mm) | Optical material |
|---|---|---|---|
| 22 | −221.07422 | 0.500105 | air |
| 23 | 1789.14029 | 21.451201 | silica |
| 24 | −452.08676 | 0.500049 | air |
| 25 | 289.17848 | 32.277024 | silica |
| 26 | −551.04966 | 0.500000 | air |
| 27 | 202.53136 | 26.972766 | silica |
| 28 | 328.68674 | 1.061663 | air |
| 29 | 141.36247 | 18.000000 | silica |
| 30 | 117.80701 | 11.679622 | air |
| 31 | 189.50028 | 15.881455 | silica |
| 32 | 126.08030 | 27.337671 | air |
| 33 | −165.54773 | 12.500000 | silica |
| 34 | 228.79250 | 30.744914 | air |
| 35 | −122.41469 | 15.783108 | silica |
| 36 | INFINITY | 14.787634 | air |
| 37 | −242.56650 | 18.003789 | silica |
| 38 | −190.83752 | 15.425110 | air |
| 39 (STOP) | INFINITY | 17.692867 | air |
| 40 | −1515.56466 | 29.747112 | silica |
| 41 | −202.63904 | 0.500000 | air |
| 42 | INFINITY | 19.137374 | silica |
| 43 | −548.37451 | 0.500000 | air |
| 44 | 365.01801 | 35.714381 | silica |
| 45 | −522.01266 | 11.339440 | air |
| 46 | −265.13180 | 18.000000 | silica |
| 47 | −393.68064 | 0.500000 | air |
| 48 | 285.54825 | 36.047364 | silica |
| 49 | −993.21023 | 0.500000 | air |
| 50 | 149.49308 | 29.913380 | silica |
| 51 | 287.03744 | 0.563679 | air |
| 52 | 129.58620 | 42.640160 | silica |
| 53 | 307.42908 | 6.661474 | air |
| 54 | 658.06363 | 28.496307 | silica |
| 55 | 62.84280 | 25.034278 | air |
| 56 | 60.40037 | 19.499050 | silica |
| 57 | 128.40582 | 1.659962 | air |
| 58 | 171.80715 | 18.547668 | silica |
| 59 | 942.00274 | 16.680533 | air |
| IMG | INFINITY | 0.000000 | |

Where the parameter definitions are the same as described above for Table 1.

In summary, the results and advantages of the projection exposure apparatus' of the present invention can now be more fully realized. The method and apparatus of the invention provides projection exposure apparatus that have large numerical apertures, large field exposure areas at the wafer plane, large reduction values and good aberration correction.

The foregoing description of the embodiments of the invention has been presented for purposes of illustration and description. It is not intended to be exhaustive or to limit the invention to the precise form disclosed. Obvious modifications or variations are possible in light of the above teachings. The embodiment was chosen and described to provide the best illustration of the principles of the invention and its practical application to thereby enable one of ordinary skill in the art to utilize the invention in various embodiments and with various modifications as are suited to the particular use contemplated. All such modifications and variations are within the scope of the invention as determined by the appended claims when interpreted in accordance with the breadth to which they are fairly, legally, and equitably entitled.

What is claimed is:

1. A projection exposure apparatus for transferring a pattern on a reticle onto a substrate, the apparatus comprising:

a support for holding a reticle in an object plane;

a support for holding a substrate in an image plane;

an illuminating system for illuminating a pattern on the reticle;

a projection lens system for projecting an image of the pattern on the reticle onto the substrate;

wherein the projection lens system comprises in order from the object plane to the image plane:

a first group of lens elements having an overall positive refractive power;

a second group of lens elements having an overall negative refractive power;

a third group of lens elements having an overall positive refractive power;

a fourth group of lens elements having an overall positive refractive power;

wherein the projection exposure apparatus satisfies the conditions:

$0.3 < |f_{G2}/L| < 0.46$ and $1.8 < |f_{G3}/L| < 4.8$, where $f_{G2}$ is the focal length of the second group of lens elements, $f_{G3}$ is the focal length of the third group of lens elements, and L is the axial distance between the object plane and the image plane.

2. The projection exposure apparatus of claim 1 wherein the projection exposure apparatus satisfies the condition:

$0.05 < |f_{G2}/f_{G3}| < 0.25$, where $f_{G2}$ is the focal length of the second group of lens elements and $f_{G3}$ is the focal length of the third group of lens elements.

3. The projection exposure apparatus of claim 2 wherein the projection exposure apparatus satisfies the condition:

$0.77 < f_{G1}/f_{G4} < 1.1$, where $f_{G1}$ is the focal length of the first group of lens elements and $f_{G4}$ is the focal length of the fourth group of lens elements.

4. The projection exposure apparatus of claim 3 wherein the projection exposure apparatus satisfies the conditions:

$0.17 < f_{G4}/F < 0.195$ and $0.14 < f_{G1}/F < 0.19$, where $f_{G4}$ is the focal length of the fourth group of lens elements, $f_{G1}$ is the focal length of the first group of lens elements and F is the overall focal length of the projection lens system.

5. The projection exposure apparatus of claim 4 wherein the projection exposure apparatus satisfies the condition:

$NA = n \sin\theta \geq 0.60$, where NA is the numerical aperture, n is the refractive index of the image space medium and θ is the angle between a marginal ray and the optical axis at the image plane.

6. The projection exposure apparatus of claim 5 wherein the second group of lens elements comprises:

a first subgroup of lens elements, wherein the first subgroup of lens elements includes at least three lens elements each having a negative refractive power; and a second subgroup of lens elements, wherein the second subgroup of lens elements includes at least two lens elements each having a positive refractive power.

7. The projection exposure apparatus of claim 6 wherein the third group of lens elements comprises:

a first subgroup of lens elements, wherein the first subgroup of lens elements includes at least two lens elements each having a positive refractive power;

a second subgroup of lens elements, wherein the second subgroup of lens elements includes at least two lens elements each having a negative refractive power; and a third subgroup of lens elements, wherein the third subgroup of lens elements includes at least two lens elements each having a positive refractive power.

8. The projection exposure apparatus of claim 7 wherein the third group of lens elements includes an aperture stop disposed between the second subgroup of lens elements in the third group of lens elements and the third subgroup of lens elements in he third group of lens elements.

9. The projection exposure apparatus of claim 8 wherein the fourth group of lens elements a first subgroup of lens elements wherein the first subgroup of lens elements includes a lens element having a positive refractive power and a meniscus lens element having a concave surface facing the lens element having a positive refractive power.

10. The projection exposure apparatus of claim 9 wherein the fourth group of lens elements further comprises:

a second subgroup of lens elements wherein the second subgroup of lens elements includes a lens element having a negative refractive power; and a third subgroup of lens elements wherein the third subgroup of lens elements includes a lens element having a positive refractive power.

11. A method of transferring a pattern on a reticle onto a wafer, the method comprising:

illuminating a pattern on a reticle;

projecting the pattern through a projection lens system onto a substrate; wherein projecting the pattern through a projection lens system includes:

projecting the pattern through a first group of lens elements having a positive refractive power;

projecting the pattern through a second group of lens elements having a negative refractive power;

projecting the pattern through a third group of lens elements having a positive refractive power;

projecting the pattern through a fourth group of lens elements having a positive refractive power; and wherein the projection lens system satisfies the conditions:

$0.3 < |f_{G2}/L| < 0.46$ and $1.8 < |f_{G3}/L| < 4.8$, where $f_{G2}$ is the focal length of the second group of lens elements, $f_{G3}$ is the focal length of the third group of lens elements, and L is axial distance between the object plane and the image plane.

12. The method of claim 11 wherein projecting the pattern through the projection lens system satisfies the condition:

$0.05 < |f_{G2}/f_{G3}| < 0.25$, where $f_{G2}$ is the focal length of the second group of lens elements and $f_{G3}$ is the focal length of the third group of lens elements.

13. The method of claim 12 wherein projecting the pattern through the projection lens system includes projecting the pattern through a projection lens system that satisfies the condition:

$$0.77 < |f_{G1}/f_{G4}| < 1.1$$

where $f_{G1}$ is the focal length of the first group of lens elements and $f_{G4}$ is the focal length of the fourth group of lens elements.

14. The method of claim 13 wherein projecting the pattern through the projection lens system includes projecting the pattern through a projection lens system that satisfies the conditions:

$$0.17 < f_{G4}/F < 0.195 \text{ and}$$

$$0.14 < f_{G1}/F < 0.191,$$

where $f_{G4}$ is the focal length of the fourth group of lens elements, $f_{G1}$ is the focal length of the first group of lens elements and F is the overall focal length of the projection lens system.

15. The method of claim 14 wherein projecting the pattern through the projection lens system includes projecting the pattern through a projection lens system that satisfies the condition:

$$NA = n \sin\theta \geq 0.60,$$

where NA is the numerical aperture, n is the refractive index of the image space medium and θ is the angle between a marginal ray and the optical axis at the image plane.

16. The method of claim 15 wherein projecting the pattern through the projection lens system includes projecting the pattern through the second group of lens elements that includes:

a first subgroup of lens elements, wherein the first subgroup of lens elements includes at least three lens elements each having a negative refractive power; and a second subgroup of lens elements, wherein the second subgroup of lens elements includes at least two lens elements each having a positive refractive power.

17. The method of claim 16 wherein projecting the pattern through the projection lens system includes projecting the pattern through the third group of lens elements that includes:

a first subgroup of lens elements, wherein the first subgroup of lens elements includes at least two lens elements each having a positive refractive power;

a second subgroup of lens elements, wherein the second subgroup of lens elements includes at least two lens elements each having a negative refractive power; and a third subgroup of lens elements, wherein the third subgroup of lens elements includes at least two lens elements each having a positive refractive power.

18. The method of claim 17 wherein projecting the pattern through the projection lens system includes projecting the pattern through the third group of lens elements that includes an aperture stop disposed between the second subgroup of lens elements in the third group of lens elements and the third subgroup of lens elements in the third group of lens elements.

19. The method of claim 18 wherein projecting the pattern through the projection lens system includes projecting the pattern through the fourth group of lens elements that includes a first subgroup of lens elements wherein the first subgroup of lens elements includes a lens element having a positive refractive power and a meniscus lens element having a concave surface facing the lens element having a positive refractive power.

20. The method of claim 19 wherein projecting the pattern through the projection lens system includes projecting the pattern through the fourth group of lens elements that further includes:

a second subgroup of lens elements wherein the second subgroup of lens elements includes a lens element having a negative refractive power; and a third subgroup of lens elements wherein the third subgroup of lens elements includes a lens element having a positive refractive power.

* * * * *